United States Patent [19]

O'Neill

[11] Patent Number: 6,075,200
[45] Date of Patent: Jun. 13, 2000

[54] STRETCHED FRESNEL LENS SOLAR CONCENTRATOR FOR SPACE POWER

[75] Inventor: Mark Joseph O'Neill, Keller, Tex.

[73] Assignee: Entech, Inc., Keller, Tex.

[21] Appl. No.: 09/343,606

[22] Filed: Jun. 30, 1999

[51] Int. Cl.[7] ............... H01L 31/0232; H01L 31/052; F24J 2/08
[52] U.S. Cl. ............ 136/246; 136/249; 126/698
[58] Field of Search .................. 136/244, 245, 136/246, 259, 292; 126/573, 698; 359/726, 742

[56] References Cited

U.S. PATENT DOCUMENTS

| | | | |
|---|---|---|---|
| 3,924,604 | 12/1975 | Anderson | 126/270 |
| 4,046,462 | 9/1977 | Miller et al. | 350/295 |
| 4,069,812 | 1/1978 | O'Neill | 126/271 |
| 4,134,387 | 1/1979 | Tornstrum | 126/270 |
| 4,173,495 | 11/1979 | Rapp et al. | 136/89 |
| 4,237,864 | 12/1980 | Kravitz | 126/425 |
| 4,453,224 | 6/1984 | Crooks, Jr. | 364/525 |
| 4,487,196 | 12/1984 | Murphy | 126/438 |
| 4,493,313 | 1/1985 | Eaton | 126/438 |
| 4,596,238 | 6/1986 | Bronstein | 126/438 |
| 4,719,903 | 1/1988 | Powell | 126/438 |
| 4,744,644 | 5/1988 | Kleinwuchter et al. | 350/608 |
| 4,848,319 | 7/1989 | Appeldorn | 126/440 |
| 5,096,505 | 3/1992 | Fraas et al. | 136/246 |
| 5,202,689 | 4/1993 | Bussard et al. | 342/10 |
| 5,210,654 | 5/1993 | Williams | 359/847 |
| 5,255,666 | 10/1993 | Curchod | 126/569 |
| 5,344,497 | 9/1994 | Fraas et al. | 136/246 |
| 5,395,070 | 3/1995 | Stirbl et al. | 244/2 |
| 5,496,414 | 3/1996 | Harvey et al. | 136/245 |
| 5,498,297 | 3/1996 | O'Neill et al. | 136/246 |
| 5,505,789 | 4/1996 | Fraas et al. | 136/246 |
| 5,578,139 | 11/1996 | Jones et al. | 136/245 |
| 5,660,644 | 8/1997 | Clemens | 136/245 |
| 5,865,905 | 2/1999 | Clemens | 136/245 |

*Primary Examiner*—Nam Nguyen
*Assistant Examiner*—Michael C. Miggins
*Attorney, Agent, or Firm*—Sankey & Luck, L.L.P.

[57] ABSTRACT

A novel, high-efficiency, extremely light-weight, robust stretched Fresnel lens solar concentrator for space power is described. It consists of a flexible Fresnel lens attached to end supports, wherein said end supports stretch the lens to maintain its proper position and shape on orbit in space. One embodiment of the new concentrator includes means for lens deployment on orbit in space. In this embodiment, prior to deployment, the flexible lens and end supports are folded into a flat, low-volume package for efficient launch into space. Another embodiment of the new concentrator includes non-deployable means of stretching the lens to maintain its proper position and shape in space. Both embodiments of the new concentrator approach will provide significant advantages over the prior art in space photovoltaic concentrator arrays. Photovoltaic concentrator arrays using the new stretched lens will be much lighter and more economical than prior space concentrator arrays. Also, photovoltaic concentrator arrays using the new stretched lens will be easier to stow into a compact volume for launch, and easier to deploy on orbit than prior space concentrator arrays. In addition, the new stretched lens will eliminate the need for a fragile glass superstrate to support the lens, substantially improving robustness of the lens.

20 Claims, 3 Drawing Sheets

STRETCHED FRESNEL LENS SOLAR CONCENTRATOR FOR SPACE POWER

FIELD OF INVENTION

The present invention relates generally to solar power systems for space satellite applications. More specifically, this invention relates to solar concentrators for space power, particularly lightweight Fresnel lens solar concentrators for photovoltaic energy conversion systems.

BACKGROUND

Prior art solar electric power supplies for space satellites use large flat plate arrays of solar cells made from silicon, gallium arsenide, or another semiconductor material. These prior art flat plate solar arrays are generally very expensive due to the large area of semiconductor material required. These prior art solar arrays are generally heavy due to the combined mass of solar cell, cover glass, and backup structure. These prior art arrays are generally bulky and fragile, complicating their packaging for launch into space. These prior art arrays are also complex to deploy on orbit, requiring mechanical means to unfold the arrays and properly position them for operation.

To minimize or overcome these problems, new approaches to solar electric power supplies for space satellites have recently been developed by Fraas and O'Neill, U.S. Pat. No. 5,344,497 and U.S. Pat. No. 5,505,789. The new approaches use Fresnel lenses to collect and focus sunlight onto very high efficiency tandem-junction solar cells. By using a relatively inexpensive Fresnel lens to collect the sunlight and to focus it onto much smaller solar cells, the cost and weight of the cells are dramatically reduced. By using very high efficiency cells, the required array area is minimized, reducing overall system weight and launch volume. The advantages of the new Fresnel lens concentrating solar electric power supply are now being widely recognized, as witnessed by the selection of this approach for the NASA Jet Propulsion Laboratory's New Millennium Deep Space One satellite which was launched Oct. 24, 1998. The Fresnel lens concentrating solar array on Deep Space One provides not only the power for the satellite, but also the power for the electric propulsion system which is propelling the probe to encounters with an asteroid and a comet.

Despite the many advantages of the Fresnel lens concentrating solar array previously invented by O'Neill and Fraas, this array still has shortcomings in need of improvement. Specifically, the Fresnel lens is presently made from a space-qualified, optically clear silicone rubber material (e.g., Dow Corning DC 93-500). This thin rubber lens (e.g., 250 microns thick) must be laminated to a thin (e.g., 80 microns thick) ceria-doped glass superstrate to maintain the required arch shape of the lens assembly. The glass is a structural component, not required for the optical functioning of the lens. Unfortunately, the glass increases the weight, cost, launch volume, and fragility of the lens. Until now, if the glass were not used, the lens would not maintain its shape, even in the zero-gravity environment of space. The presently used glass/silicone Fresnel lens also requires a supporting structure to properly position the lens above the solar cells. This lens support structure adds further weight, cost, and complexity to the solar power system. The presently used glass/silicone Fresnel lens is also not flexible enough to be flattened for compact launch stowage, resulting in a higher than desired launch volume. The presently used glass/silicone Fresnel lens is affected by the difference in thermal expansion coefficients of the glass and silicone layers, causing either stresses or strains in the lens during temperature variations which occur when the satellite moves in and out of the Earth's shadow.

One means of addressing some of the problems associated with the glass arch in the presently used glass/silicone Fresnel lens is to make the polymer lens from a stronger, thicker material, obviating the structural need for the glass arch. Many stronger, thicker polymer lens materials have been evaluated by the present inventor and his colleagues at NASA and in the aerospace industry; these candidate monolithic lens materials include DuPont Teflon® and Dyneon THV® and similar fluoropolymer materials from other suppliers. These flexible lens materials offer the possibility of flattening the arched lens in a compact stow position during satellite launch, with mechanical deployment of the arches on orbit in space. The present inventor has worked closely with both NASA and AEC-ABLE Engineering Company on the development of such flexible monolithic polymer lenses. In U.S. Pat. No. 5,496,414, Harvey et al. of AEC-ABLE describe one novel means of stowing and deploying such a monolithic polymer lens. In U.S. Pat. No. 5,578,139, Jones et al. of AEC-ABLE describe another novel means of stowing and deploying such a monolithic polymer lens. However, these prior art lenses must be thick enough and strong enough to be self supporting during ground testing, and therein lies their disadvantage. The lens thickness required to be self-supporting under ground testing is typically 250 microns or more for an 8 cm lens aperture width. Since the density of fluoropolymers is about double the density of the normal silicone rubber lens material, and the total lens thickness is about the same, the flouropolymer lenses weigh about twice as much as the silicone lenses. Thus, even with the added weight of the glass arch superstrate, the old glass/silicone lens is typically lighter than the new monolithic fluoropolymer lens. In addition, the monolithic fluoropolymer lens material does not have the proven successful space flight history and heritage of the silicone lens material.

To overcome these problems with prior art Fresnel lens solar concentrators for space power applications, I have invented a stretched Fresnel lens, which provides all of the benefits of solar concentration, while overcoming the optical efficiency, complexity, cost, weight, launch volume, fragility, and differential thermal expansion problems of the prior art approaches.

Other inventors have proposed many approaches to lightweight solar concentrators for both terrestrial power and space power applications. Indeed, several have proposed stretched membrane concentrators in the past. However, all of these approaches have had substantial shortcomings, as described in more detail the following paragraphs, according to the type of prior art.

Most of the prior art solar concentrators which employ stretched optical elements are reflective concentrators which use mirrored surfaces to focus sunlight. These prior art stretched membrane reflective concentrators are described in the following two paragraphs, which address terrestrial and space reflective concentrators, respectively.

Terrestrial Reflective Stretched Membrane Concentrators: In U.S. Pat. No. 3,924,604, Anderson describes a terrestrial, stretched membrane, flat reflective heliostat for focussing sunlight onto a central receiver on top of a tall tower. Similarly, in U.S. Pat. No. 4,046,462, Miller et al. describe a terrestrial, stretched membrane, three-dimensionally curved reflective solar concentrator. Likewise, in U.S. Pat.

No. 4,134,387, Tornstrum describes a terrestrial, stretched membrane, segmented flat reflective concentrator with replaceable reflective material on reels. In similar vein, in U.S. Pat. No. 4,237,864, Kravitz describes a terrestrial, stretched membrane, parabolic drape reflective concentrator. Similarly, in U.S. Pat. No. 4,487,196, Murphy describes a terrestrial, stretched membrane, three-dimensionally curved reflective concentrator. In like vein, in U.S. Pat. No. 4,493,313, Eaton describes a terrestrial, stretched membrane, parabolic trough reflective concentrator. Very similarly, in U.S. Pat. No. 4,596,238, Bronstein describes another terrestrial, stretched membrane, parabolic trough reflective concentrator. Likewise, in U.S. Pat. No. 4,744,644, Kleinwuchter et al. describe a terrestrial, stretched membrane, parabolic dish reflective concentrator. In like vein, in U.S. Pat. No. 5,210,654, Williams describes a terrestrial, stretched membrane, three-dimensionally curved reflective concentrator.

Space Reflective Stretched Membrane Concentrators: In U.S. Pat. No. 4,719,903, Powell describes a space, stretched membrane, parabolic trough reflective concentrator. Similarly, in U.S. Pat. No. 5,202,689, Bussard et al. describe a space, stretched membrane, peripherally supported reflective concentrator. Likewise, in U.S. Pat. No. 5,660,644, Clemens describes a space, stretched membrane, parabolic trough reflective concentrator. In like vein, in U.S. Pat. No. 5,865,905, Clemens describes a space, stretched membrane, parabolic trough reflective concentrator, with replaceable reflective material on reels, similar to the terrestrial system of Tornstrum in the previous paragraph.

All of these prior art stretched membrane reflective concentrators, whether meant for terrestrial or space application, suffer from an overwhelming, 100-fold disadvantage in shape error tolerance, compared to my new stretched lens refractive concentrator. All reflective concentrators, whether stretched membrane or rigid in construction, require a much higher degree of surface accuracy than an optimized refractive concentrator, as discussed by O'Neill in Chapter 10 of the textbook, *Solar Cells and their Applications*, published by John Wiley in 1995. An optimized refractive concentrator corresponds to the Fresnel lens configuration taught by O'Neill in U.S. Pat. No. 4,069,812. Since reflective concentrators need more than 100 times better shape accuracy than an optimized refractive concentrator, it will be more difficult, expensive, and risky to implement a space power system using the prior art reflective stretched membrane solar concentrators, than one using my new refractive stretched membrane Fresnel lens solar concentrator.

A few prior art solar concentrators have proposed thin, non-self-supporting Fresnel lenses stretched between rigid structural elements. The present inventor has worked with 3M in the terrestrial solar concentrator area and with Harris Corporation in the space solar concentrator area. In U.S. Pat. No. 4,848,319, Appeldorn of 3M teaches a thin linear Fresnel lens stretched between longitudinal structural elements, thereby creating a polygonal lens in cross section, for terrestrial applications. Similarly, Grayson et al. of Harris teach a more complex parquet of thin, flat, Fresnel lens elements, stretched between radial elements, to form an umbrella-like dome lens for space applications. Both of these prior art stretched lens approaches have many deficiencies, compared to my new design. The approach of Appeldorn provides a poor straight-line-segment approximation of the desired, ideal curvilinear arch lens shape. Furthermore, the longitudinal structural elements of Appeldorn block a large fraction of the available lens aperture, thereby preventing sunlight from entering the concentrator.

Thus, Appeldorn's approach fails to achieve either the desired lens shape or the high optical efficiency needed for good solar concentrator performance. Similarly, the approach of Grayson et al. is likewise flawed, providing flat lens elements instead of the desired curved lens elements, and suffering even more light blockage than Appeldorn's approach, due to the complex umbrella-like support structure.

In addition, both Appeldorn and Grayson et al. teach a relatively complex structure, which will be both heavy and costly. For space applications, a lightweight structure is crucial, since the present cost of launching 1 kg of satellite mass into geostationary orbit is between $50,000 and $100,000.

Still further, both Appeldorn and Grayson et al. fail to adequately address one critical problem with stretched lens concentrators: differential thermal expansion between the lens material and the support structure, especially in the direction of greatest linear dimension. The presently used silicone lens material expands and contracts at a relatively gigantic rate with temperature: more than 300 parts per million per degree Centigrade (C.). Furthermore, solar arrays on geostationary (GEO) satellites undergo huge temperature swings from the warm, illuminated portions of the orbit, to the cold, dark, eclipsed portions of the orbit, when the satellite is in the Earth's shadow. A typical array must be able to survive at least 1,500 thermal cycles from −180C. to +80C. array temperature. An unrestrained 30 cm (1 foot) long lens will expand and contract more than 2 cm (8%) in length during this temperature excursion. In contrast, a typical graphite/epoxy space structure will expand and contract several hundred times more slowly with temperature than the lens material. Thus, the differential thermal expansion problem must be addressed for an acceptable stretched lens space solar concentrator, but the prior art does not teach a solution to this problem.

In contrast to the prior art, my new invention uses one-dimensional lengthwise tension to support the thin lens material in the space environment. This novel approach enables the lens to maintain an ideal, arched, curvilinear shape, with absolutely no aperture blockage over the full stretched length of the lens. In addition, my invention allows the thin, ultralightweight lens to be folded flat against the photovoltaic receiver/waste heat radiator assembly, for minimal launch volume. Once on orbit in space, my lens can be readily deployed by allowing the end arch structures to pop up into place, thereby lightly tensioning the lens in one direction. Furthermore, my invention is compatible with the optimized refractive concentrator approach taught by O'Neill, U.S. Pat. No. 4,069,812. Since this optimized lens maximizes both optical efficiency and shape error tolerance, it is ideally suited for a stretched lens concentrator application. Still furthermore, by maintaining a small lengthwise stretching force on the lens, either with springs or flexible structure, differential thermal expansion and contraction of the lens relative to the receiver/radiator structure is easily accommodated.

The dramatic extent of the improvement provided by my invention can be appreciated by comparing the power-o-mass ratio, also called specific power, of existing, state-of-the-art space solar arrays to future arrays employing my new invention. The current SCARLET array, which uses glass/silicone lenses, has an outstanding specific power of about 50 Watts per kilogram. But an array using my new stretched lens concentrator should extend this critical system performance index to 300 Watts per kilogram, a six-fold gain. This extraordinary prediction is based on measured mass and performance values for functional prototypes of my invention. These prototypes provided a measured 92% net optical efficiency and weighed less than 1 kilogram per square meter of lens aperture area, including not only the lens weight, but also the spring-loaded pop-up end arches, the waste heat radiator, and simulated solar cells.

In summary, my stretched Fresnel lens invention overcomes many prior art problems in space solar concentrator arrays.

OBJECTS AND ADVANTAGES

Accordingly, several objects and advantages of my invention are to provide improved solar concentrators for space power applications, said improved concentrators providing lower mass, lower launch volume, lower cost, easier deployment on orbit, enhanced tolerance of the space environment, and higher optical performance than prior art concentrators. Other objects and advantages of my invention include improved solar concentrators for space photovoltaic power systems, said improved concentrators providing higher specific power in terms of system mass per unit power produced.

Still further objects and advantages will become apparent from a consideration of the ensuing description and accompanying drawings.

Figure 1:
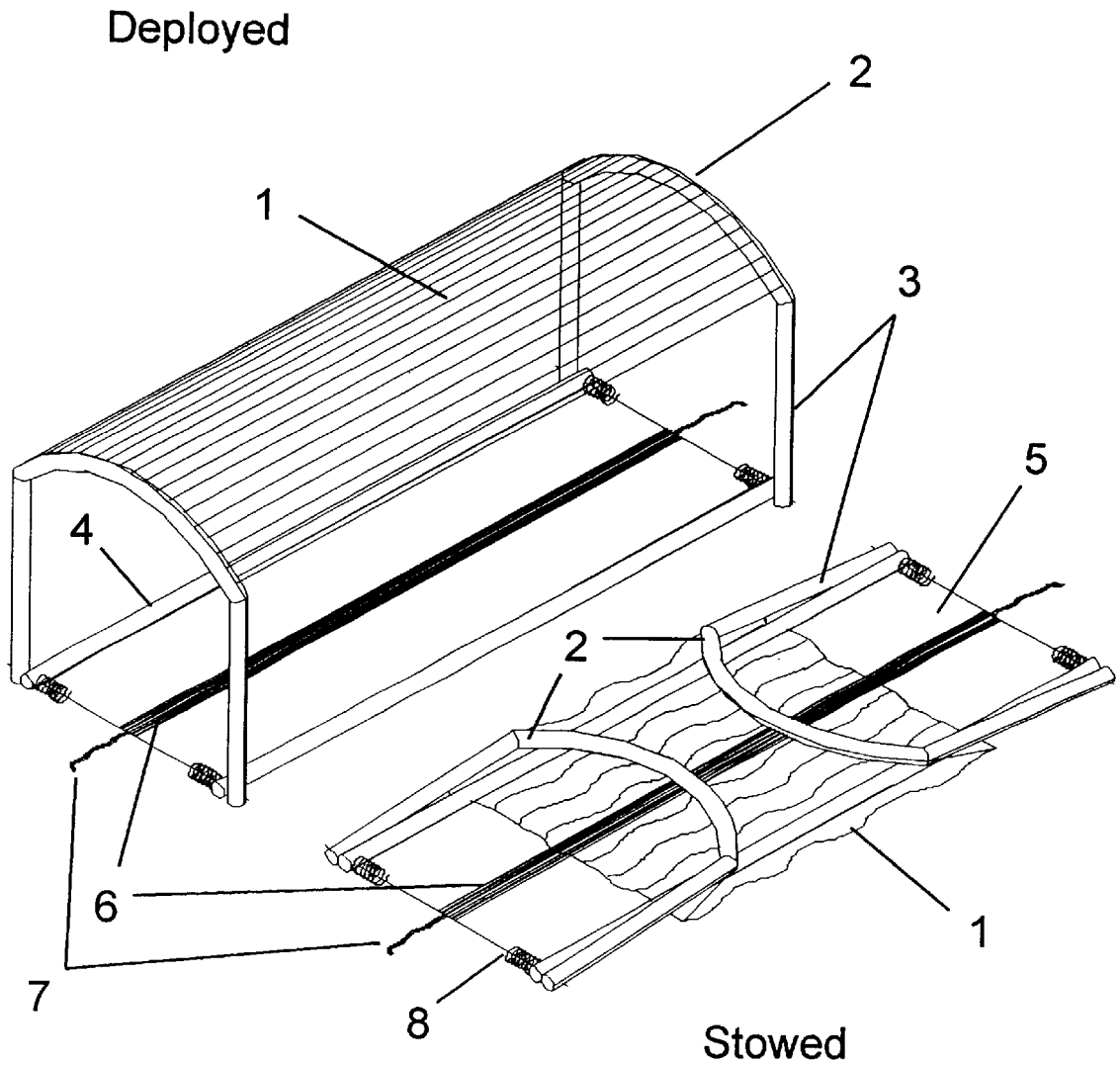
FIG. 1 is a perspective view of a deployable embodiment of my invention, showing it in both deployed and stowed conditions.

REFERENCE NUMERALS IN DRAWINGS 1 flexible line-focus Fresnel lens optical concentrator
2 curved arch structure attached to the flexible Fresnel lens
3 rotatable vertical support posts for the arch structure
4 compression structural elements holding end arch/vertical posts apart
5 radiator surface for dissipating waste heat to space
6 focussed energy photovoltaic receiver/converter
7 means for removing electrical power from receiver/converter
8 springs to deploy arch/vertical post structure and to stretch deployed lens
9 flexible line-focus Fresnel lens optical concentrator
10 curved arch structure attached to the flexible Fresnel lens
11 compression structural elements holding end arches apart
12 spring to provide desired lens tension
13 structural element to cover and guide spring
14 arrow showing direction of tension force in stretched lens

SUMMARY

In accordance with the present invention, a solar energy concentrator comprises at least one refractive optical element, said optical element producing a focal line of concentrated sunlight; and at least one structural element, said structural element providing a tension force in said optical element, said tension force having at least one component generally parallel to said focal line.

PREFERRED EMBODIMENTS—DESCRIPTION

FIG. 1 shows the preferred deployable embodiment of my stretched lens space solar concentrator invention, showing both a deployed and a stowed view. A flexible, arch-shaped, line-focus Fresnel lens 1 forms the front or sun-facing surface of the solar concentrator. This lens 1 is made from a transparent polymeric material, such as a clear silicone rubber or fluoropolymer, by molding or similar processes well known to those skilled in the art. The outer convex surface of the lens can be coated with well known thin films to provide protection against ultraviolet radiation, monatomic oxygen, and electrostatic discharge effects in space. The lens 1 includes a plurality of small linear prisms of varying angles selected to provide a line focus of incident sunlight, configured using Fresnel lens design principles well known to those skilled in the art. An energy receiver/converter 6 is located in the line focus produced by lens 1.

This receiver/converter 6 includes electrically interconnected photovoltaic cells, such as gallium arsenide or silicon cells, which are sized to match the line focus produced by lens 1. The receiver/converter 6 is mounted to and supported by the back surface 5, which may also serve as the radiator surface to dissipate waste heat from the receiver/converter 6. The back surface 5 is made from a thermally conductive material, such as aluminum or graphite/epoxy composite. The lens 1 is attached to an end arch structure 2 on each end of said lens. The end arch structure 2 is attached to two vertical post structures 3. The entire assembly of end arch structure 2 and vertical post structures 3 is attached to compressive structural elements 4, with a hinge assembly allowing rotation of the end post structures 3 relative to the compression structures 4. Springs 8 are used to provide the torque necessary to rotate the vertical post structures from their stowed position to their deployed position, said rotation comprising approximately 90 degrees of angular motion. Once deployed, a gentle lengthwise tension in the lens 1 stretches and supports the lens as a stretched membrane structure. The continuous gentle tension also enables the lens to undergo large temperature changes without generating high stresses in either the lens 1 or the structural elements 2, 3, and 4.

My space solar concentrator invention in FIG. 1 is folded down into the substantially flat stowed position for launch, to minimize the launch volume. Once the concentrator is on orbit in space, the unit is deployed by rotating the vertical post structures 3 upward until these structures, working together with the arch structures 2, impart a desired gentle tension force into the lens 1. This force can be traced to the torque provided by spring elements 8 which effect the deployment on orbit. The concentrator is then pointed toward the sun, with the lens 1 intercepting and focussing solar rays onto the photovoltaic energy receiver 6, which converts a substantial portion of the radiant solar energy into electricity, which is delivered to the spacecraft by appropriate electrical current conductors 7. Focussed sunlight which is not converted to electricity becomes waste heat, which is conducted outward from the receiver 6 into the radiator surface 5, where it is then radiated to deep space. If properly designed, the radiator 5 will prevent overheating of the photovoltaic receiver, typically maintaining cell temperatures in the 70–80 C. range.

Figure 2:
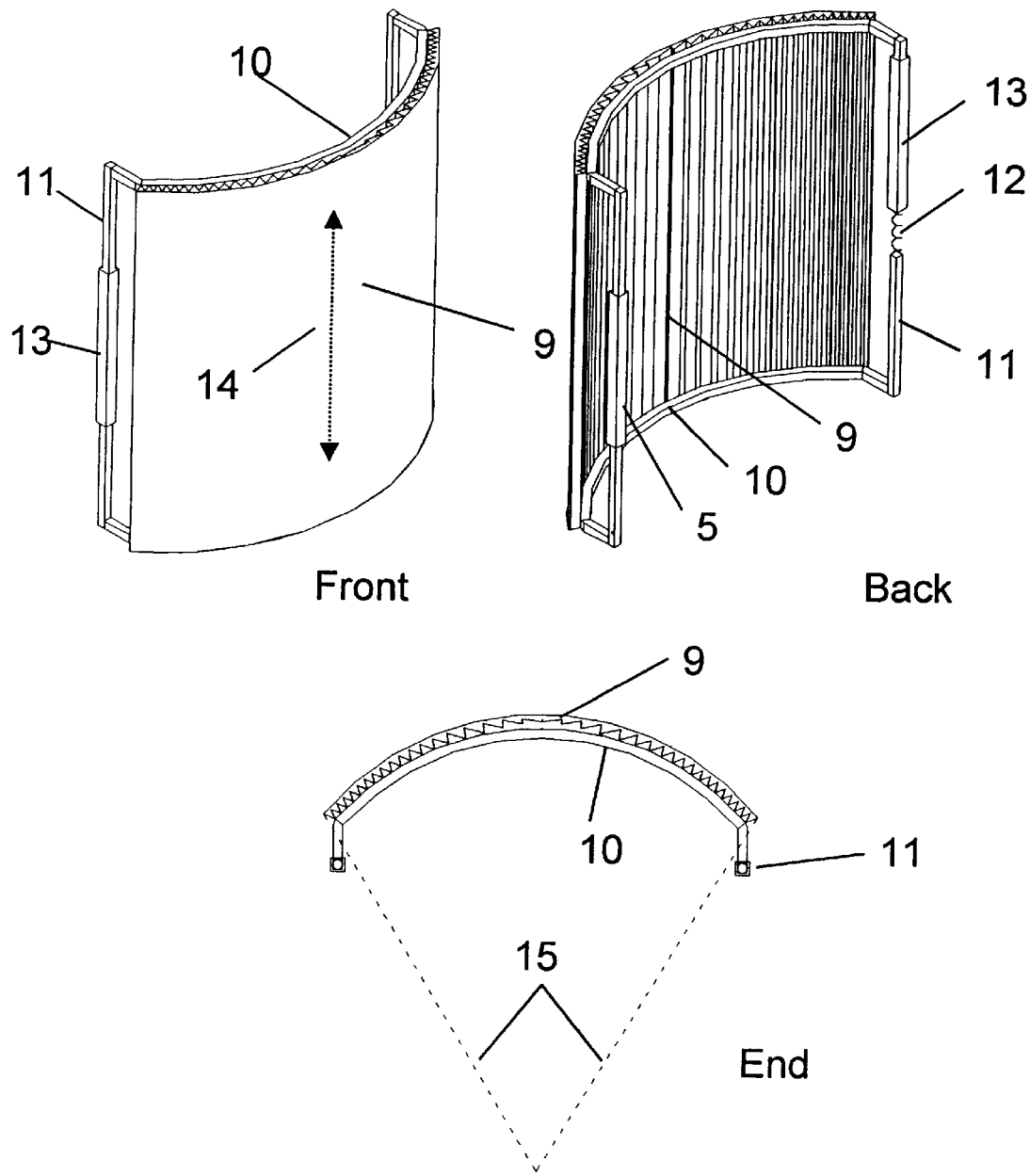
FIG. 2 is a set of perspective views and a cross sectional view of a non-deployable embodiment of my invention.

FIG. 2 shows the preferred non-deployable embodiment of my invention, in several views. In FIG. 2, a flexible, arch-shaped, line-focus lens 9 is attached to an end arch structure 10 on each end of the lens. The lens 9 materials and configuration are substantially the same as for the previously described lens 1 in FIG. 1. Working cooperatively, the two end arch structures 10 on both ends of the lens 9 impart a gentle lengthwise tension into the lens, stretching it and thereby supporting it as a stretched membrane. To counteract this lens tension force, shown by the arrows 14 in FIG. 2, two compression structural members 11 hold the two end arches 10 apart from one another. The degree of tension can be controlled by an inline spring 12 integrated into the compression members 11. A cover/guide assembly 13 can be mounted around each spring 12. To prevent any optical shadowing loss by the structural elements 11, 12, and 13, these elements are located outside of the converging ray envelope 15 which eventually forms the line focus of sunlight.

Both embodiments of my invention, the deployable one of FIG. 1 and the non-deployable one of FIG. 2, provide the same means of support for the thin, flexible lens, namely a gentle lengthwise tension which forms a stretched membrane lens. Both embodiments provide the desired arch shape of the lens, which is ideal from optical efficiency, focussing, and error tolerance considerations. Both embodiments prevent any blockage of sunlight by lengthwise structural elements, thereby further maximizing optical efficiency. And both embodiments of my new invention accommodate differential thermal expansion between the polymer lens and the structural elements of the concentrator, without imparting large stresses into either the lens or the structural elements. Both embodiments also offer extremely low weight, since the lens need not be self supporting on its own.

Figure 3:
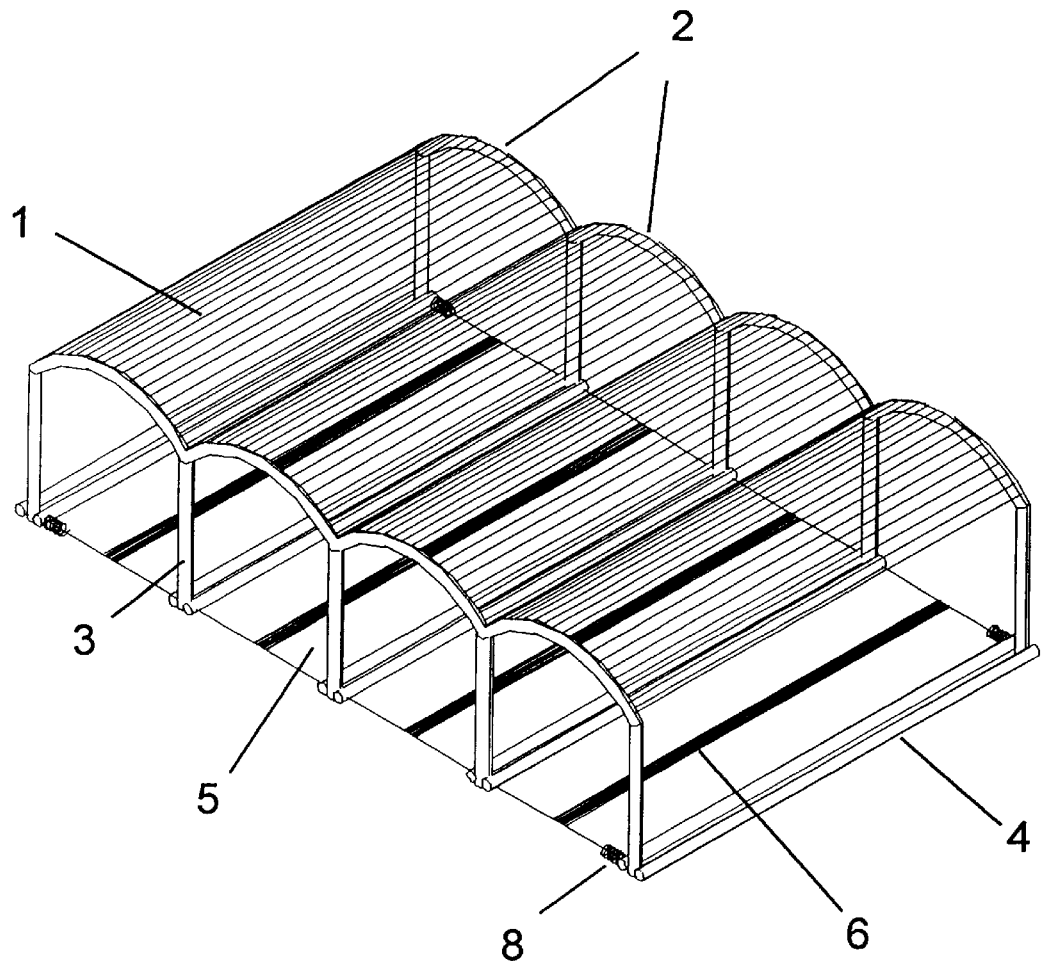
FIG. 3 is a perspective view of another deployable embodiment of my invention.

FIG. 3 shows a deployable, multiple-lens embodiment of my invention, which is expected to be the most common embodiment for most space solar power applications. After deployment on orbit, each lens 1 is stretched between two end arches 2 to provide support of the lens as a stretched membrane structure. All of the end arches 2 may be integrated together with all of the vertical posts 3 into an end structure assembly, which shares the same two corner springs 8. The entire array of lenses and end arch/post assemblies would be folded down against the radiator structure 5 for a compact, substantially flat launch volume. Once deployed on orbit, the lenses 2 would automatically assume their proper positions to focus sunlight onto an array of photovoltaic receiver assemblies 6 mounted in the focal lines of the lenses. Means for pointing the entire array of lenses at the sun, and for extracting the electrical power from the array of receivers, are well known to those of ordinary skill in the art of space solar power systems, and will not be detailed here.

PREFERRED EMBODIMENTS—OPERATION

The stretched lens solar concentrator of FIG. 1 functions in the following manner. A flexible linear Fresnel lens 1 is attached on both ends to an end arch structure 2, which is attached to corner posts 3, which are attached to compressive structural elements 4, in a manner which allows rotational movement of the corner posts 3 relative to the structural elements 4. The structural elements 4 may be integrated with a back surface radiator 5, to which an energy receiver/converter 6 is mounted. This energy receiver/converter 6 is located in the focal line of the linear Fresnel lens 1, to intercept the concentrated sunlight produced by the lens 1 and to convert a portion of the incident solar energy into a more useful form, such as direct current electrical energy. Such conversion can be accomplished using photovoltaic cells, also called solar cells, as the primary energy conversion devices in the energy receiver/converter 6. Useful energy from the receiver/converter 6 is delivered from the receiver/converter 6 to the satellite using energy extraction means 7.

The lens 1, end arches 2, and corner posts 3 are rotated down against the back surface radiator 5 to achieve a compact assembly volume for launch into space. Once on orbit in space, the lens 1, end arches 2, and corner posts 3 are rotated up to place the lens 1 in its proper position relative to the energy receiver/converter 6 to allow the lens 1 to properly focus incident sunlight onto the receiver/converter 6. This rotational deployment can be accomplished using springs 8 or other mechanical devices. Such springs 8 can also provide a slight lengthwise tension in the deployed lens 1, thereby supporting the lens in a desired shape.

After deployment in space, the Fresnel lens 1 is always maintained in a sun-facing orientation to capture the maximum amount of incident solar flux. The solar rays are first refracted by the smooth, convex outer surface of the lens 1 as the rays enter the lens material, and are further refracted by the faceted, concave inner surface of the lens 1 as the rays exit the lens material. The combined refraction effect of the inner and outer surfaces of the lens 1 causes the solar rays to converge into a narrow, elongated, rectangular focal region, where an energy receiver/converter 6 is placed to intercept, capture, and convert the focussed sunlight into a useful energy output. The energy receiver/converter 6 can utilize photovoltaic cells to perform a direct conversion of sunlight to direct-current electricity.

Such photovoltaic cells can be made from a variety of semiconductor materials, including silicon, gallium arsenide, gallium indium phosphide, germanium, gallium antimonide, or other material or combination of materials. Since the best photovoltaic cells only convert about 30% of the incident sunlight to electricity, the remaining 70% must be dissipated as waste heat. In space, the only effective method of dissipating waste heat is by radiation to space. This radiative cooling requires significant radiator area to maintain the cell temperature in the optimal range. By mounting the energy receiver/converter directly against the back surface 5 of the concentrator, and by making the back surface 5 of a heat-conducting material such as aluminum or graphite epoxy composite, the back surface 5 can serve as a very efficient radiator.

Furthermore, by making the back surface 5 from a rigid material such as aluminum or graphite epoxy composite sheet, and/or by adding structural elements 4 to the back surface 5, this back surface 5 can be the main structural element in the concentrator. The multi-use back surface 5 can also serve as a convenient stowing surface, against which the stowed lens 1, end arch structure 2, and corner posts 3 can be folded for low-volume stowage during launch into space. Finally, energy extraction means 7 are provided to allow the useful energy to be removed from the receiver/converter for use on board the satellite or space probe. This energy extraction means 7 can be a set of wires or electrically conductive ribbons which carry the direct current electricity to the power management and distribution system of the satellite.

The stretched lens solar concentrator in the upper portion of FIG. 1 is shown in its deployed configuration on orbit in space. The stretched lens solar concentrator in the lower portion of FIG. 1 is shown in its stowed configuration prior to deployment in space. The stowed concentrator will be substantially flat, with the lens 1, end arch structures 2, and corner posts 3 all folded down against the back radiator surface 5. Once on orbit, the concentrator will be deployed by the controlled rotation of the corner posts 3 relative to the back radiator surface, resulting in the stretched lens achieving the correct final position relative to the energy receiver/converter 6.

The basic approach of stretching a flexible lens between end arches to provide a refractive solar concentrator is novel and useful even without considering the means of deployment on orbit in space. Thus, FIG. 2 shows another simpler embodiment of my invention, a non-deployable stretched lens concentrator. In this embodiment, the flexible Fresnel lens 9 is stretched between end arches 10, with compressive structural elements 11 connecting the end arches 10 on both ends of the lens 9. An inline spring 12 or other mechanical device can be used to provide a continuous controlled amount of tension in the lens 9. Said spring 12 can be contained and guided by a casing 13. The one-dimensional lens tension force is shown by the arrow 14. To prevent any blockage of sunlight, the compressive structural elements 11 are located below the lens 9 and outside of the bundle of solar rays 15 converging toward the focal line. This non-deployable embodiment of my stretched lens solar concentrator could be used as a direct substitute for the heavier, costlier, and more fragile glass/silicone laminated lens used in the past.

FIG. 3 shows the deployed version of the most preferred embodiment of my invention, namely a deployable multi-lens, multi-receiver solar array. This array in FIG. 3 operates in essentially the same manner as the deployable single-lens, single-receiver unit of FIG. 1. However, by providing a larger sun-gathering aperture area, the multi-lens unit of FIG. 3 allows much higher power levels to be reached on orbit. In addition, by sharing common components, such as the sun-tracking means, the multi-lens array of FIG. 3 will be simpler, lighter, and more cost-effective than the single-lens unit of FIG. 1.

CONCLUSIONS, RAMIFICATIONS, AND SCOPE

Accordingly, it can be seen that my invention provides higher optical performance, lower weight, smaller stowage volume, larger tolerances for manufacturing and operational inaccuracies, and improved robustness, compared to prior art solar concentrators for space power.

Although the description above contains many specificities, these should not be construed as limiting the scope of the invention but as merely providing illustrations of some of the presently preferred embodiments of this invention. Various other embodiments and ramifications are possible within its scope. For example, the energy receiver/converter of FIGS. 1 and 3 could be configured as a heat collector rather than as a photovoltaic converter, if thermal energy were desired as the useful energy output instead of electricity.

Furthermore, while the preferred embodiments described above showed purely mechanical means for stretching the flexible Fresnel lens solar concentrator, these examples are not meant to exclude other means of accomplishing the stretching of the flexible lens. For example, inflatable structural elements could be used in place of mechanical structural elements to accomplish the lens stretching and/or deployment in the present invention. Alternatively, shape memory alloy structural elements could be used in place of mechanical structural elements to accomplish the lens stretching and/or deployment in the present invention. Thus, solar concentrators which utilize my new stretched lens configuration, accomplished using any of a variety of means to provide the lens tensioning, also fall within the scope of my invention.

Thus the scope of the invention should be determined by the appended claims and their legal equivalents, rather than by the specific examples given.

What is claimed is:

1. A solar energy concentrator comprising at least one refractive optical element for producing a focal line of concentrated sunlight; and at least one structural element, where said structural element includes means to provide a tension force in said refractive optical element in a direction generally parallel to the focal line.

2. The solar energy concentrator of claim 1, wherein said refractive optical element is a Fresnel lens configured to focus sunlight.

3. The solar energy concentrator of claim 1, wherein said refractive optical element is curvilinear in shape.

4. The solar energy concentrator of claim 1, wherein said refractive optical element is made of transparent silicone rubber.

5. The solar energy concentrator of claim 1, wherein said refractive optical element is made of fluoropolymer.

6. The solar energy concentrator of claim 1 wherein said focal line is provided with photovoltaic cells for converting at least a portion of incident sunlight into electrical power.

7. The solar energy concentrator of claim 1, wherein said refractive optical element has a smooth outer surface and a prismatic inner surface.

8. The solar energy concentrator of claim 1, wherein said refractive optical element includes an ultraviolet radiation rejection coating on its sun-facing surface.

9. A solar energy concentrator comprising the following elements:
    at least one flexible Fresnel lens configured to focus sunlight into a focal region, where said region defines a major axis;
    at least one support element with two ends;
    means for applying a biasing force to said Fresnel lens between said two ends of said support element in a direction generally parallel to said major axis.

10. The solar energy concentrator of claim 9, wherein said Fresnel lens is configured to provide a line focus of sunlight.

11. The solar energy concentrator of claim 9, wherein said support element includes means for compact stowage during launch and controlled deployment on orbit in space.

12. A space power system comprising:
    at least one Fresnel lens adapted to focus sunlight into a focal region defining a major axis;
    at least one energy receiving means located in said focal region; and
    deployable support means for biasing said Fresnel lens into proper position and shape relative to said energy receiving means generally parallel to said major axis.

13. The space power system of claim 12, wherein said energy receiving means includes at least one photovoltaic cell.

14. The space power system of claim 12, wherein said Fresnel lens is configured to provide a line focus of sunlight.

15. The space power system of claim 12 further including a contiguous plurality of Fresnel lenses to produce a plurality of focal regions, where each said Fresnel lens contains one energy receiving means.

16. The space power system of claim 12, wherein said Fresnel lens is curvilinear in shape.

17. The space power system of claim 12, wherein said deployable support means include end support elements attached to both ends of said lens, said end support elements including mechanical means of deployment.

18. The space power system of claim 12, wherein said deployable support means include end support elements attached to both ends of said lens, said end support elements including inflationary means of deployment.

19. The space power system of claim 12, wherein said deployable support means include end support elements attached to both ends of said lens, said end support elements including shape memory alloy material.

20. The space power system of claim 12, wherein said energy receiving means includes one or more surfaces configured to dissipate waste heat by radiation to space.

* * * * *